United States Patent [19]
Gotoh et al.

[11] Patent Number: 5,290,485
[45] Date of Patent: Mar. 1, 1994

[54] THIRD-ORDER NONLINEAR OPTICAL ELEMENT

[75] Inventors: Tetsuya Gotoh; Tosiyuki Kondoh; Keiichi Egawa, all of Otsu; Ken-ichi Kubodera, Isehara, all of Japan

[73] Assignees: Toray Industries, Inc.; Nippon Telegraph and Telephone Corporation, Tokyo, Japan

[21] Appl. No.: 863,483

[22] Filed: Apr. 2, 1992

Related U.S. Application Data

[63] Continuation of Ser. No. 225,758, Jul. 29, 1988, abandoned.

[30] Foreign Application Priority Data

Jul. 29, 1987 [JP] Japan .................. 62-189830
Feb. 18, 1988 [JP] Japan .................. 63-36294

[51] Int. Cl.$^5$ .................. F21V 9/04; F21V 9/00; G02B 6/00
[52] U.S. Cl. .................. 252/589; 252/582; 252/587; 359/328; 359/329
[58] Field of Search ........ 252/582, 600, 587, 589; 359/328, 329, 326

[56] References Cited

U.S. PATENT DOCUMENTS

| | | | |
|---|---|---|---|
| 3,975,289 | 8/1976 | Froix | 252/300 |
| 4,529,273 | 7/1985 | Cronin-Golomb et al. | 350/354 |
| 4,818,898 | 4/1989 | Anderson et al. | 307/427 |
| 4,871,236 | 10/1989 | Gemma et al. | 350/355 |
| 4,879,479 | 11/1989 | Frazier et al. | 350/96.12 X |
| 4,955,977 | 9/1990 | Dao et al. | 350/96.34 |
| 5,030,387 | 7/1991 | Matsuoka et al. | 252/582 |
| 5,080,832 | 1/1992 | Etter et al. | 252/587 |
| 5,086,239 | 2/1992 | Wang | 359/328 |

FOREIGN PATENT DOCUMENTS

| | | |
|---|---|---|
| 0240106 | 10/1987 | European Pat. Off. |
| 0243807 | 11/1987 | European Pat. Off. |
| 2177226 | 1/1987 | United Kingdom |

OTHER PUBLICATIONS

Vizgert et al., Sov. J. Quant. Electron. 214 12(2) 1982.
Anderson et al Chem. Phys. Lett. 134(4) 392, 1987.
Gotoh, T. et al Nonlinear Optical Prop. of Materials Proc. Aug. 22-25, Troy, N.Y., 1988.
Gotoh, T. et al J. Opt. Soc. Am. B 6, 703, 1989.
Tam. W. et al SPIE, vol. 971, 107, 1988.
Green, M. et al Nature, 330, 360, 1987.
Chemical Abstracts 96:151905g, 1982.
Chemical Abstracts 90:143744q 1979.
Chemical Abstracts 94:111808e 1981.
Chemical Abstracts 102:14401t 1985.

(List continued on next page.)

*Primary Examiner*—Philip Tucker
*Attorney, Agent, or Firm*—Fish & Richardson

[57] ABSTRACT

A third-order nonlinear optical element showing wide employable wave-length range of input light, high speed operation and low light intensity of input light is disclosed. The third-order nonlinear optical element of the present invention has at least two substantially optically smooth surfaces and comprise a charge-transfer complex consisting essentially of (i) at least one electron-accepting component selected from the group consisting of cyano compounds, quinones, nitro compounds, acid anhydride, halogenes, and halogenated carbons; and (ii) at least one electron-donating component selected from the group consisting of unsaturated cyclic hydrocarbon compounds, unsaturated heterocyclic compounds, chalcogen-containing compounds, quarternary unsaturated heterocyclic compounds and metals The charge-transfer complex of nonlinear optical element of the present invention is formed of said at least one electron-accepting component and said at least one electron-donating component in the ground state and at least one of said components is an organic compound having $\pi$-conjugated system.

17 Claims, 7 Drawing Sheets

OTHER PUBLICATIONS

Rappoport, *The Chemistry of the Cyano Group*, Interscience Publishers, John Wiley & Sons, 1970, pp. 639–669.

Mulliken et al., *Molecular Complexes: A Lecture and Reprint Volume*, Wiley-Interscience, 1969, pp. 134–137 and 158–159.

Miller et al., *Synthesis and Properties of Low-Dimensional Materials*, New York Academy of Sciences, 1978, pp. 293–300.

Sauteret et al., *Physical Review Letters* 36(16):956–959 (Apr. 1976).

Kajazar et al., *Polymer Journal*, 19(2):275–284 (1987).

Maloney, C. & Blau, W., *Resonant third-order hyperpolarizabilities of large organic molecules*, Journal of the Optical Society of America B, vol. 4, No. 6, Jun. 1987, pp. 1035–1039.

Zyss, J., *Nonlinear Organic Materials for Integrated Optics: a Review*, Journal of Molecular Electronics, vol. 1, 1985, pp. 25–45.

M. M. Labes, et al., "Organic Semiconductors. II. The Electrical Resistivity of Organic Molecular Complex", J. Chem. Phys., vol. 33, No. 3, pp. 868–872 (1960).

H. Kuroda et al., "Semiconductive Properties of Tetracyanoethylene Complexes and Their Absorption Spectra", J. Chem. Phys., vol. 36, No. 2, pp. 457–462 (1962).

THIRD-ORDER NONLINEAR OPTICAL ELEMENT this application is a continuation of U.S. application Ser. No. 07/225,758, filed Jul. 29, 1988, now abandoned.

BACKGROUND OF THE INVENTION

I. Field of the Invention

This invention relates to a third-order nonlinear optical element. The optical element of the present invention can be used in high speed optical data processing systems and optical communication systems.

II. Description of the Related Art

When a strong electric field (E) such as laser beam is applied to a substance, the substance shows electric-polarization (P) which is expressed by the following general equation:

$$P = X^{(1)}E + X^{(2)}EE + X^{(3)}EEE + $$

(wherein X(1) means linear optical susceptibility and $X^{(i)}$ (i is an integer of not less than 2) means nonlinear optical susceptibility)

The nonlinear optical effects are those expressed by the high order terms of E, i.e., terms of E of not less than square. The second harmonic generation (SHG) expressed by the second term and the third harmonic generation (THG) expressed by the third term are well known as the effects of frequency conversion. The third term also excerts effects of light intensity dependent optical constants, such as effect of optically induced refractive-index change, nonlinear absorption effect, the second-order electric optical (Kerr) effect and four-wave parametric mixing (phase-conjugated-wave generation) effect, any one of effects is important in the applied optics field.

The effect of optically induced refractive-index change is an effect by which the refractive index (n) of a substance is changed depending on the intensity of the impinging light in accordance with the equation of $$n = n_0 + n_2 I$$

(wherein $n_0$ is a constant, $n_2$ is nonlinear refractive index coefficient, and I is intensity of impinging light). By making an element from the substance showing this effect and by combining the element with other optical elements such as optical resonator, polarizer and reflecting mirror, devices such as optical bistable device and phase-conjugated-wave generator, which are important in optical data processing systems and optical communication systems, can be constituted.

As an example of such devices, optical bistable device will now be explained. An optical medium having a nonlinear refractive index is sandwiched between a pair of vacuum-deposited dielectric mirrors with a reflectance of about 90%. An input light impinges on one of the mirrors and exits from another mirror as an output light after repeatedly passing through the substance. If the wave-length of the input light is slightly changed to satisfy the resonance condition, the intensity of the output light (Pt) changes in response with the intensity of the input light (Pi) as shown in FIGS. 1 (b) and (c). The principle of this phenomenon is detailed in Appl. Phys. Lett. vol 35, p. 451 (1976). The responses shown in FIGS. 1 (b) and 1 (c) correspond to optical limiting and optically bistable responses, respectively, and they may be applied to reshaping of the waveform of input light pulse, all-optical switch, optical memory and optical logic operation behavior in optical communication systems and optical data processing systems.

As the nonlinear optical element, the following three characteristics are extremely important:
1) Width of the wave-length range of input light which may be employed,
2) Minimum intensity of the input light which is required for the operation, and
3) the response time required for following the change of the intensity of the light signal.

As a conventional nonlinear optical element, super lattice semiconductor thin films crystal produced by alternately and repeatedly growing GaAs and GaAlAs are used. The operation of this element is based on the principle that the excitons are excited in the crystal by the absorbed light so that the refractive index shows light intensity-dependence. Although the element is excellent in that the minimum intensity of the input light required for the operation is as low as $5 \times 10^4$ W/cm$^2$, it has drawbacks in that the wave-length range of the input light which may be employed is restricted to a very narrow range in the vicinity of the exciton absorption spectrum, and in that the response time is determined by the exciton lifetime, so that it cannot be used for the optical signal processing which requires a response time of shorter than $3 \times 10^{-8}$ second.

In another conventional optical bistable device, a glass cell in which optical Kerr liquid, carbon disulfide ($CS_2$) is filled is employed, and a pair of external mirrors are employed in place of the vapor-deposited mirrors. With this conventional device, since the operation principle is based on the fact that the refractive index shows light intensity-dependence by the rotational arrangement of the molecules in response to the light-electric field (molecular-rotational orientation Kerr effect), although the employable wave-length range of the input light is as wide as from visible light to near infrared light, the device has drawbacks in that the minimum light intensity required for the operation is as high as $10^7$–$10^8$ W/cm$^2$ or the element must be made large because the efficiency of molecular-rotational orientation Kerr effect of the carbon disulfide is small, and in that the response time is determined by the rotational relaxing time of the molecules, so that it cannot be used for the optical signal processing which requires a response time of shorter than $10^{-11}$–$10^{-12}$ second.

In order that the nonlinear optical element may practically be used, it is desired that semiconductor laser having a wave-length range of 0.65–2.3 μm and an effective output power of 30 mW can be used as a light source.

As is apparent from the above description, the performance of the nonlinear optical element is substantially entirely determined by the characteristics of the nonlinear optical substance. Thus, nonlinear optical materials in which 1) the employable wave-length range of input light employed is wide, 2) the minium intensity of the input light required for the operation is low, and 3) the response time required for following the change of the intensity of the light signal is short, are now intensively looked for.

Recently, organic compounds which have a π-conjugated system such as aromatic ring, double bond and triple bond, especially polydiacetylene-based compounds are drawing attention. For example, poly (2,4-hexadiyn-1,6-diol bis(p-toluenesulfonate) (PTS for short) has a third-order nonlinear optical susceptibility $X^{(3)}$ of as high as $1 \times 10^{-10}$ esu in our measurement at 1.90 µm of resonant wavelength region (when converted into nonlinear refractive-index coefficient $n_2$, this corresponds to $n_2 = 2 \times 10^{-12}$ $(W/cm^2)^{-1}$)), while G. Sauteret reported the values $8.5 \times 10^{-10}$ esu at 1.89 µm of resonant wavelength region and $1.8 \times 10^{-10}$ esu at 2.62 µm of non-resonant wavelength region (Phys. Rev. Letters, Vol 36, pp. 16 (1976). Anyway, $X^{(3)}$ of PTS is larger than that of carbon disulfide at least by two orders of magnitude. Further, since the nonlinear optical effect is entirely based on the $\pi$-polarization in a molecule, and not on the absorption where the light and the molecules or crystal lattices interact, the response time for following the intensity change of the light signal is as short as $10^{-14}$ seconds. Still further, the employable wave-length of the input light ranges as wide as from 0.65 µm to 2.0 µm.

The polydiacetylene compounds represented by PTS are produced by polymerizing diacetylene monomers in crystal state. However, after the polymerization, the resultant polydiacetylene compounds are insoluble and infusible, so that they are hard to process. That is, it is difficult to obtain a polydiacctylene-based nonlinear optical element which has a desired shape or desired surface smoothness. Thus, nonlinear optical element comprising the PTS has not yet been practically used.

Further, from a practical point of view, it is desired to improve the operation performance of the element, to reduce the output power of the light source and to make the optical element in small size, by employing a nonlinear optical material with nonlinear optical effects greater than those of PTS.

SUMMARY OF THE INVENTION

Accordingly, the object of the present invention is to provide a high performance nonlinear optical element exhibiting a high nonlinear optical effect, for which the employable wave-length range of input light is wide, the minium intensity of the input light required for the operation is low, and by which the response time required for following the change of the intensity of the light signal is short, which may be operated by using as the light source a currently available semiconductor laser and which has a good processability.

The present inventors have found that the object may be accomplished by employing a nonlinear optical element consisting essentially of some charge-transfer complex.

That is, the present invention provides a third-order nonlinear optical element having at least two substantially optically smooth surfaces, comprising a charge-transfer complex consisting essentially of (i) at least one electron-accepting component selected from the group consisting of cyano compounds, quinones, nitro compounds, acid anhydride, halogenes, and halogenated carbons, and (ii) at least one an electron-donating component selected from the group consisting of unsaturated cyclic hydrocarbon compounds, unsaturated heterocyclic compounds, chalcogen-containing compounds, quarternary unsaturated heterocyclic compounds and metals; the charge-transfer complex being formed of said at least one electron-accepting component and said at least one electron-donating component in the ground state; at least one of said components being an organic compound having $\pi$-conjugated system.

The third-order nonlinear optical element of the present invention exhibits large nonlinear optical effect. The employable wave-length range of the input light for the element of the present invention is wide, and the minimum intensity of the input light required for the operation of the element is low. Further, the response time is short and the element may be operated by using a currently available semiconductor laser as the light source. Still further, the nonlinear optical materials of the element in the present invention has a good processability, so that it may be shaped into a desired shape, and the substantially optically smooth surfaces can be formed easily. The third-order optical element of the present invention has another advantage that it shows third-order nonlinear optical effect alone and does not show the second-order nonlinear optical effect, so that the third-order nonlinear optical effect is not contaminated with the second-order nonlinear optical effect. Thus, by employing the third-order nonlinear optical element of the present invention, the third-order nonlinear optical devices such as optical bistable device, all-optical switch and phase-conjugated-wave generator which have desired characteristics and which can be usable in practice can be constructed.

BRIEF DESCRIPTION OF THE DRAWINGS

FIG. 1 (b) and (c) show the characteristics between the input light intensity and the output light intensity, which are observed with the optical element shown in FIG. 1 (a);

FIG. 4 (d) shows pump-light wave-length dependence of the third harmonic generation (THG) observed with PTS, TCNE/perylene complex and TCNQ/perylene complex;

DETAILED DESCRIPTION OF THE PREFERRED EMBODIMENTS

Figure 1A:
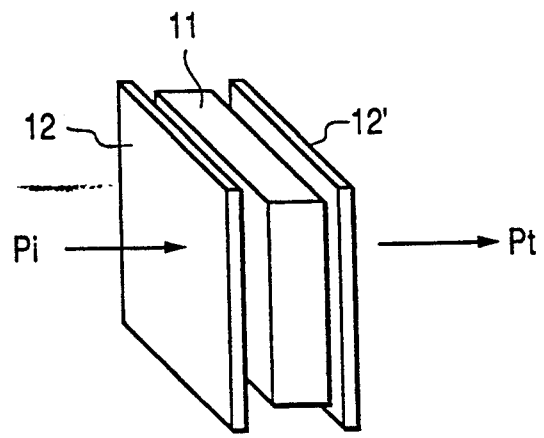
FIG. 1 (a) is a schematical perspective view of an embodiment of a third-order nonlinear optical element of the present invention.

The charge-transfer complexes employed in the optical element of the present invention consists essentially of an electron-accepting component and an electron-donating component, and at least one of the components is an organic compound having $\pi$-conjugated system. In the charge-transfer complexes, the third-order nonlinear optical effect is given by the optically induced supra-molecular $\pi$-polarization, and not by the intramolecular electron-polarization. Although charge-transfer complexes per se are known, the fact that the third-order nonlinear optical effect may be given by the optically induced supra-molecular $\pi$-polarization was first discovered by the present inventors.

The charge-transfer complexes used in the present invention is a non-bonding complexes in which the formation of the complex is accomplished by the charge-transfer force, which consists essentially of at least one electron-accepting component (a molecule or an atom having electron-accepting property) and at least one electron-donating component (a molecule of an atom having electron-donating property). At least one of the electron-accepting component and the electron-donating component is an organic compound having a $\pi$-conjugated systems such as those containing aromatic ring, double bond or triple bond because the electronic polarization giving the nonlinear optical effect responding to the optical electric field is made large. Preferably, both of the components are organic components having $\pi$-conjugated systems. In this case, most of the charge-transfer complexes form molecular crystals, i.e., most of the charge-transfer complexes are non-ionic charge-transfer complexes, and they form crystals of the mixed stack structure which will be hereinafter described in detail referring to FIG. 2. The tetracyanoethylene (TCNE)-perylene complex and 7,7,8,8-tetracyanoquinodimethane (TCNQ) - perylene complex are preferred charge-transfer complex of this type.

The electron-accepting component of the charge-transfer complexes employed in the present invention is selected from the group consisting of cyano compounds, quinones, nitro compounds, acid anhydride, halogenes, and halogenated carbons. Among these, cyano compounds having at least one dicyanomethylene group and quinones having at least one quinone unit are especially preferred. This is because that such compounds have an especially high electron affinity and excell in the planar configuration which are advantageous for molecular packing in the formation of the complex. 7,7,8,8-tetracyanoquinodimethane (TCNQ) is an example of an excellent electron-accepting component of this type.

Preferred examples of the cyano compounds may include cyanoethylenes such as tetracyanoethylene (TCNE), tricyanoethylene, methyltricyanoethylene carboxylate, hexacyanobutadiene; aromatic cyano compounds such as tetracyanobenzene; tetracyanoquinodimethanes such as TCNQ and 11,11,12,12-tetracyanonaphthoquinodimethane (TNAP); cyanoalkylene compounds such as 2,5-bis(-dicyanomethylene)-2,5-dihydrothiophene, 2,5-bis(-dicyanomethylene)-2,5-selenophene, hexacyanotrimethylenecyclopropane and 2,4-bis(dicyanomethylene)-1,3-dithioethane; and cyano quinazoline compounds such as tetracyano-quinoquinazolinoquinazoline.

Preferred examples of the quinones may include p-benzoquinone (BQ), naphthoquinone, 9,10-phenanthorenequinone (PhQ), chloranil (CA), 2,3-dichloro-5,6-dicyano-1,4-benzoquinone (DDQ) and 11,11,12,12-tetracyano-1,4-naphthoquinodimethane.

Preferred examples of the nitro compounds may include aromatic nitro compounds such as trinitrobenzene and picric acid; and 4,7-trinitrofluorenone (TNF).

Preferred examples of the acid anhydride may include maleic anhydride and pyromellitic acid anhydride.

Preferred examples of the halogen and halogenated carbons may include bromine, iodine, tetrabromomethane and bromotrichloromethane.

On the other hand, the electron-donating components of the charge-transfer complexes employed in the present invention is selected from the group consisting of unsaturated cyclic hydrocarbon compounds, unsaturated heterocyclic compounds, chalcogen-containing compounds, quarternary unsaturated heterocyclic compounds and metals. Among these, unsaturated cyclic hydrocarbon compounds are especially preferred because the ionization potential is relatively low (i.e., easy to ionize), introduction of substituent groups for lowering the ionization potential, such as amino group, mono- or dialkyl amino groups, hydroxyl group and alkoxy group is easy, and excell in the planar configuration which are advantageous for molecular packing in the formation of the complex. Polycyclic aromatic compounds such as perylene are excellent electron-donating compounds of this type.

Preferred examples of the unsaturated cyclic hydrocarbon compounds may include monocyclic or polycyclic aromatic compounds such as naphthalene, anthracene, phenanthrene, pyrene, N,N,N'N'-tetramethyl-p-phenylenediamine (TMPD), hydroquinone, durene, N,N-dimethyl-$\alpha$-naphthylamine, diaminonaphthalene, diaminopyrene and derivatives thereof; and the compounds having aromatic ring and $\pi$-conjugated system such as stilbene and diaminostilbene.

Preferred examples of the unsaturated heterocyclic compounds may include pyridine, quinoline, phenothiazine, indole, skatole, thymine, furan, benzofuran, thiophene, selenophene and derivatives thereof, as well as those containing these compounds and $\pi$-conjugated system.

Preferred examples of the chalcogen-containing compounds may include tetrathiafulvalenes such as tetrathiafulvalene (TTF) and tetraselenafulvalene; tetrathiatetracenes such as tetrathiatetracene (TTT), tetraselenatetracene; bithiapyranes such as bithiapyrane (BTP) and tetraphenylbithiapyrane.

Preferred examples of the quarternay unsaturated heterocyclic compounds may include N-methylphenadium, 1,2-di(N-ethyl-4-pyridinium) ethylene (DEPE), quinolinium and N-methylacridinium.

Preferred examples of the metals may include copper, silver, lead, nickel, lithium, sodium, potassium, barium, chromium, molybdenum, tungsten, cobalt, iron, antimony, cesium and magnesium.

Other examples of the electron-accepting component and the electron-donating components which can constitute the charge-transfer complex are described in, for example, J. S. Miller and A. J. Epstein, "Synthesis and Properties of Low-Dimensional Materials", Annals of the New York Academy of Sciences, vol. 313, pp. 25–78 and 269–292, 1978; and W. E. Hatfield, "Molecular Metals", Plenum Press, New York, pp. 15–34, 1979; and Z. Rappoport, "The chemistry of the cyano group", Interscience Pub., Chap. 9, pp. 423–638, 1970.

The electron-accepting component and the electron-donating component should be selected such that the difference (Ip−Ea) of the electron affinity (Ea) and the ionization potential (Ip) is large enough to be capable of forming charge-transfer complex in the ground state.

As may be understood from the above description, the most preferred charge-transfer complex may consist of a compound having at least one dicyanomethylene group as the electron-accepting component and a monocyclic or a polycyclic aromatic compound as the electron-donating compound. In fact, as shown in the examples described later, TCNE-perylene complex and TCNQ-perylene complex which are involved in this category show very large third-order nonlinear optical effect which cannot be obtained with organic third-order nonlinear materials ever known.

Both of the electron-accepting component and the electron-donating component are in the ground state. Namely, they form a charge-transfer complex without aid of photoexcitation.

Figure 2:
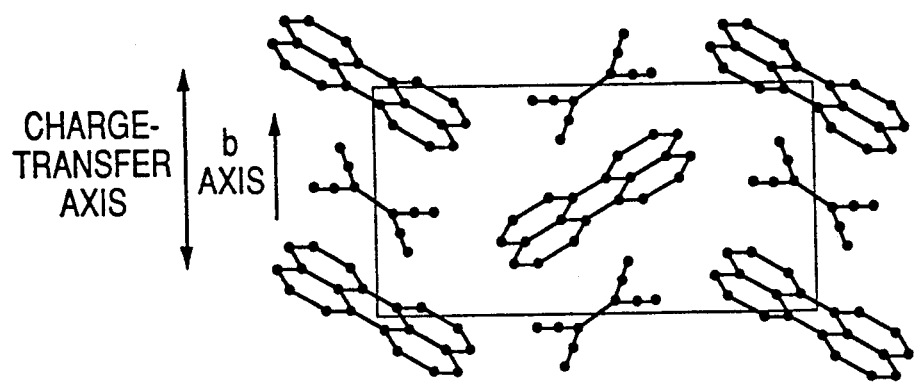
FIG. 2 shows a mixed stack crystal structure of TCNE/perylene complex in which donors and acceptors stack alternately plane-to-plane.
Figure 3A:
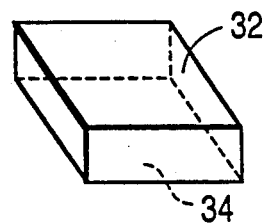
FIG. 3 (a) to (i) show various forms of the third-order nonlinear optical element of the present invention.
Figure 3E:
Figure 3B:
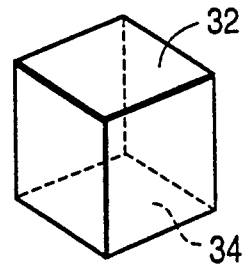
Figure 3F:
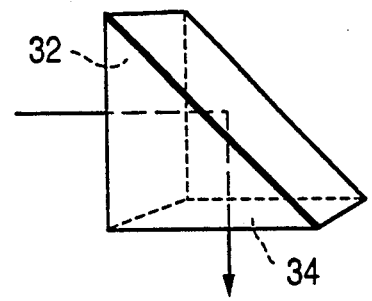
Figure 3C:
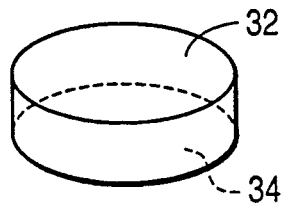
Figure 3G:
Figure 3D:
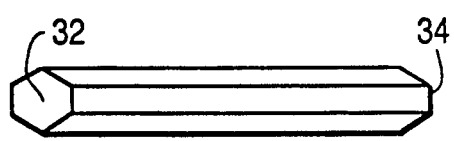
Figure 3H:
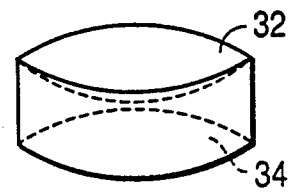
Figure 3I:
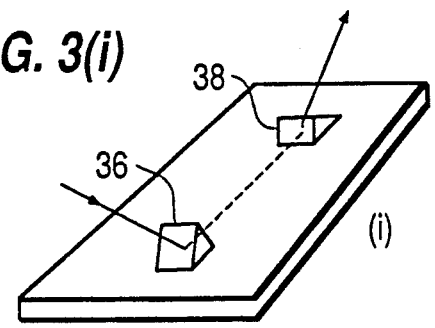
Figure 4A:
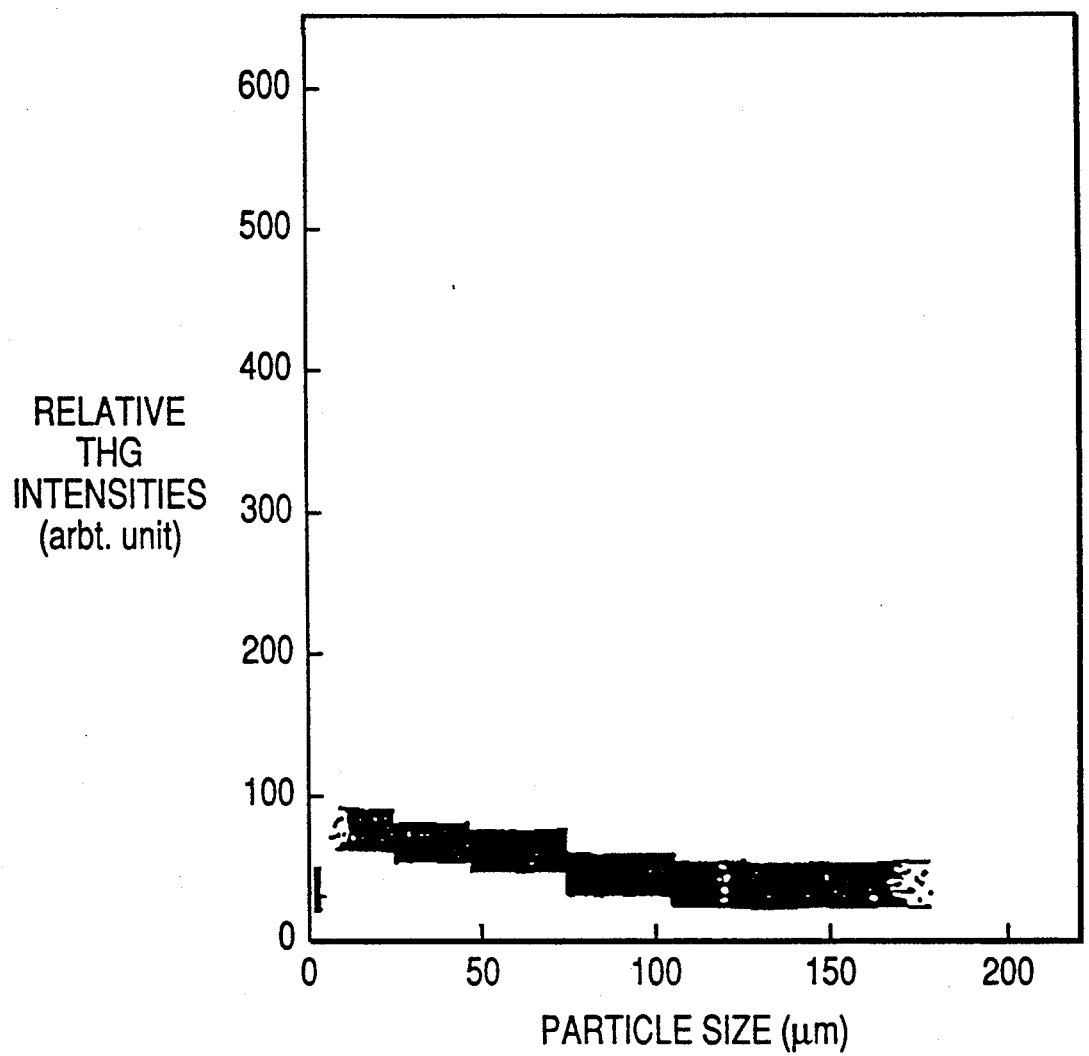
FIG. 4 (a) to (c) show particle-size dependence of the third harmonic generation (THG) observed with PTS, TCNE/perylene complex and TCNQ/perylene complex, respectively.
Figure 4B:
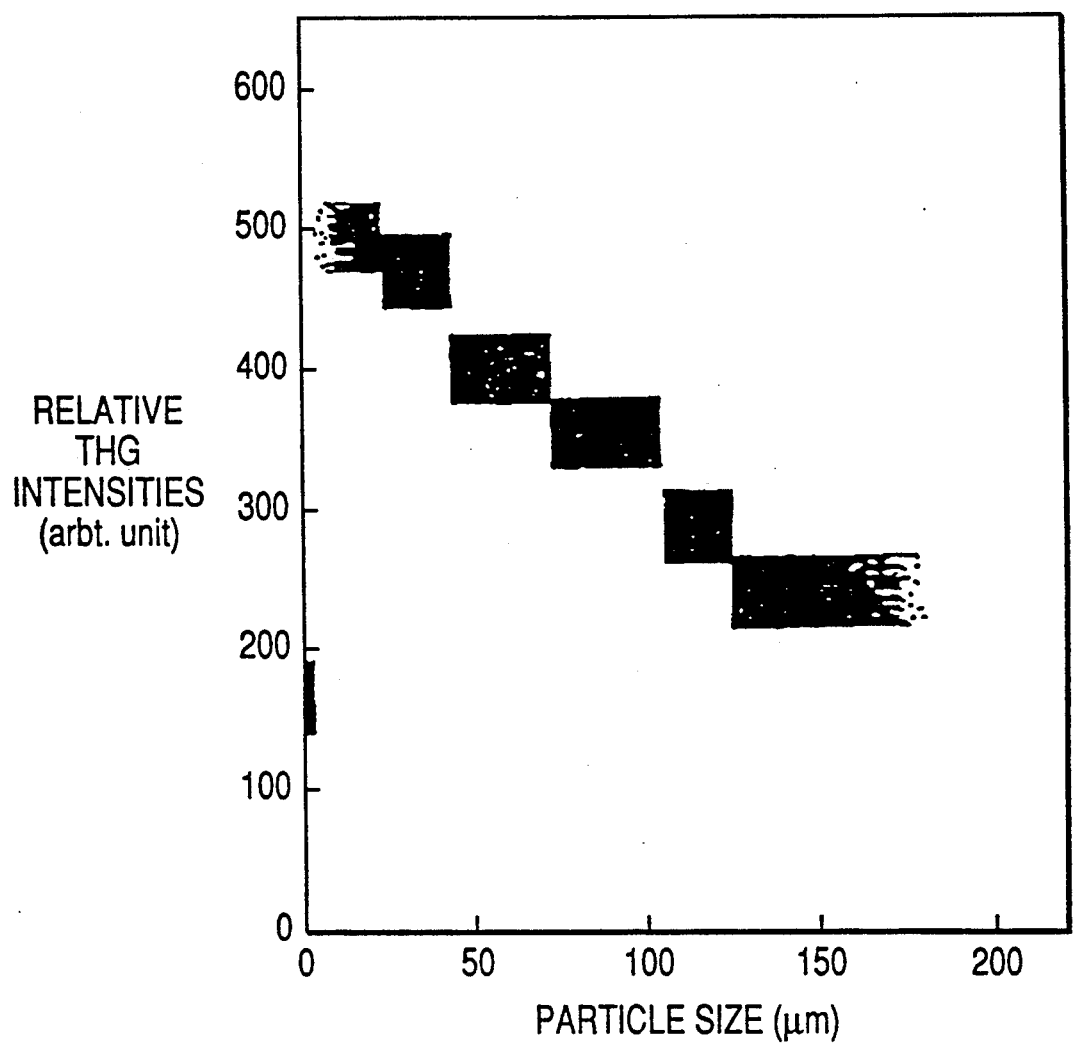
Figure 4C:
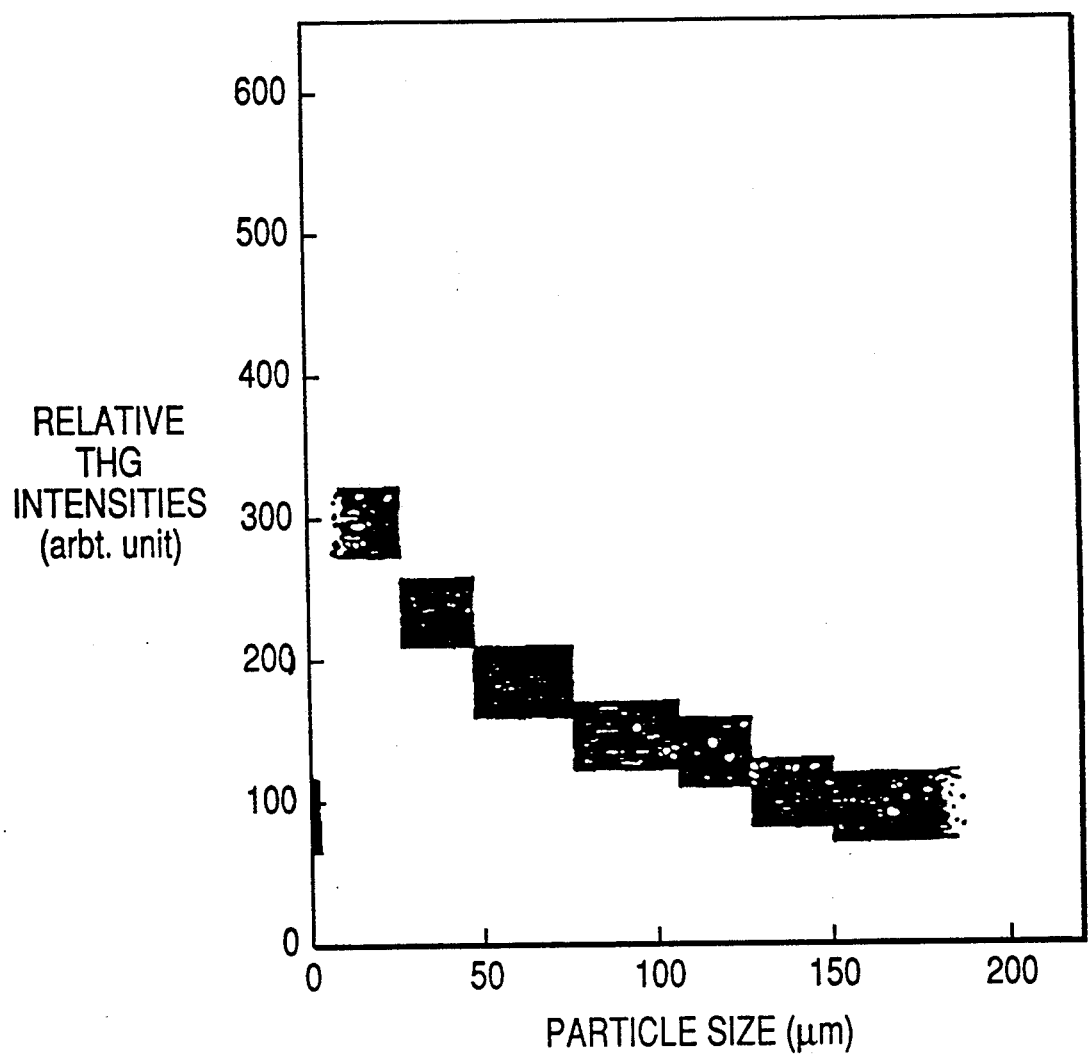
Figure 4D:
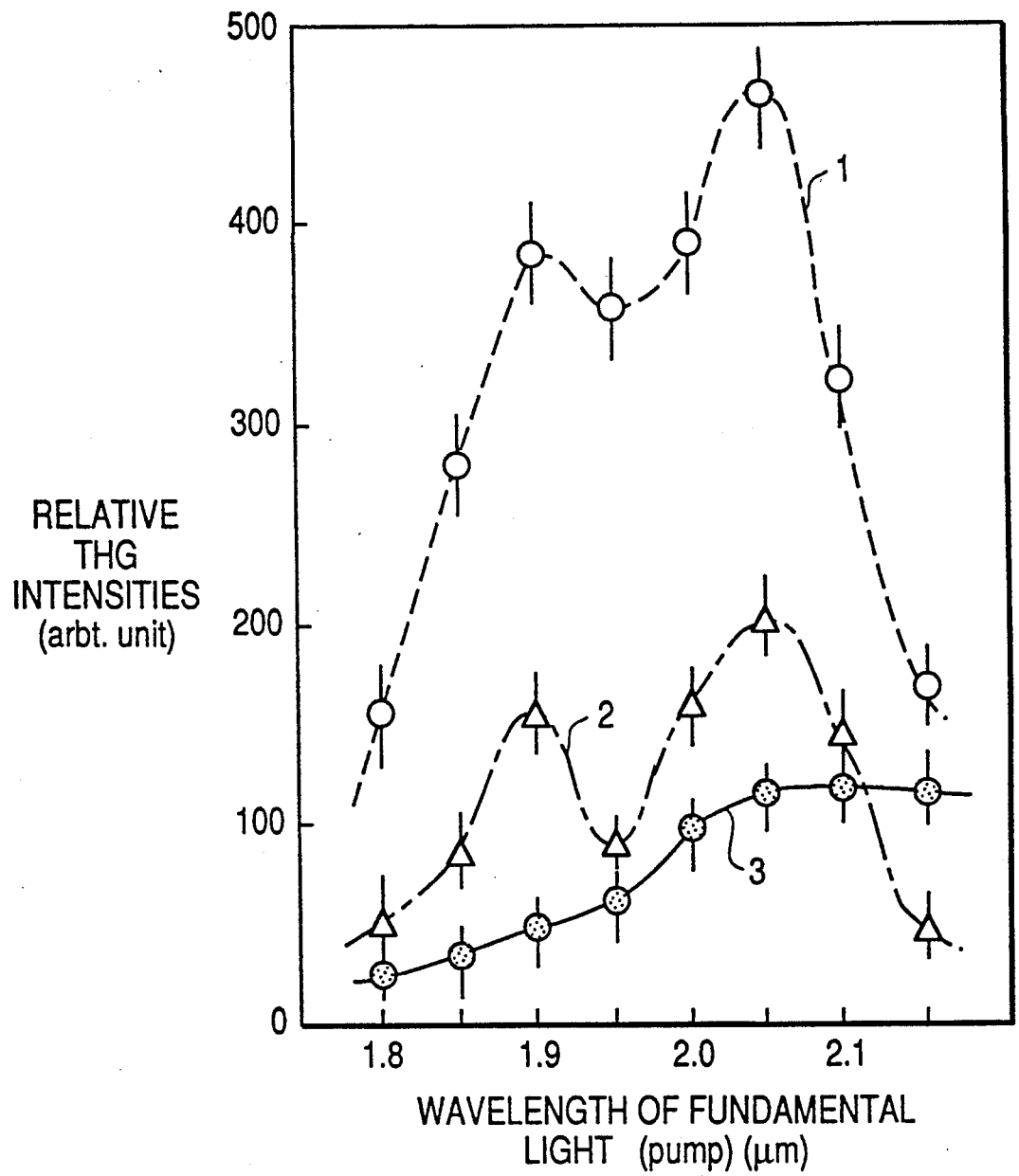

The charge-transfer complexes which may be employed in the present invention may have a mixed stack structure in which donors and acceptors stack alternately plane-to-plane or a segregated stack structure in which donors and acceptors form separate donor stacks and acceptor stacks. The charge-transfer complexes having the mixed stack structure are preferred. The crystal structure of the TCNE/perylene complex which has the mixes stack structure is schematically shown in FIG. 2. The direction of the charge-transfer is shown by the arrow. Thus, when viewed along the charge-transfer direction, TCNE and perylene stack alternately. The mixed stack structure will be further discussed later.

The molar ratio of the electron-accepting component to the electron-donating component may usually be 1:1, but may also be 1:2, 1:3, ... or 2:1, 3:1, ..., and the ratio is not restricted to integer-to-integer ratio. Further, the charge-transfer complex may be composed of three or more species. As an example, DEPE-TCNQ-$H_2O$ (molar ratio 1:4.5:x) is known.

In a preferred mode of the invention, at least one hydrogen in the electron-accepting element and/or the electron-donating element is substituted by a heavy hydrogen. By substituting the hydrogen with the heavy hydrogen, the transparency of the complex in the near infrared region is promoted mainly by the shift of the overtone and the combination tone of the stretching vibration of the hydrogen to the longer wave-length side, so that the optical damage which may be caused by pumping-light absorption may be reduced and the employable wave-length range of the input light may be widen. On the other hand, the degree of the third-order nonlinear optical effect are not substantially degraded by the presence of the heavy hydrogen.

The charge-transfer complex may be used in various forms. For example, small crystals of the complex may be dispersed in a polymeric solid, or may be in the form of a solid solution, an amorphous molded article or a crystal. The reason why the charge-transfer complex may be used in various forms is that the third-order nonlinear optical effect is obtainable even if structure of materials (substances) is centro-symmetric. It should be noted, however, it is most preferred that the charge-transfer complex be in the form of a single crystal. If the charge-transfer complex is in the form of a single crystal, maximum nonlinear optical effect may be obtained by the aid of the anisotropy of the charge-transfer complex in the nonlinear optical effect.

The third-order nonlinear optical element of the present invention has at least two substantially optically smooth surfaces. The term "optically smooth surface" herein means a very smooth surface of which surface roughness is not greater than several times of the wave-length of the input light. Input light impinges on one of the optically smooth surfaces, and the output light exits from the other surface. The substantially optically smooth surfaces are necessary so as to eliminate the loss by scattering. The optically smooth surface is not necessarily a flat surface but may also be a curved surface.

Needless to say, it is preferred that the substantially optically smooth surfaces are substantially parallel to the axis exhibiting maximum third-order nonlinear optical susceptibility. As mentioned above, the charge-transfer complex preferably has a mixed stack structure. In the optical element of the present invention employing the charge-transfer complex having a mixed stack structure, the substantially optically smooth surfaces are not perpendicular to the charge-transfer axis of the complex, and preferably substantially parallel to the charge-transfer axis of the charge-transfer complex. In the optical element employing a charge-transfer complex with the segregated stack structure, the substantially optically smooth surfaces are not parallel to the charge-transfer axis of the complex, and preferably perpendicular to the charge-transfer axis of the complex. It should be noted that in some special cases, one surface may act as the input light-impinging surface and the output light-exitting surface. For example, when a single crystal of the charge-transfer complex has a substantially optically smooth surface with relatively large area, a portion of the surface may be used as the input light-impinging surface and another portion of the same surface may be used as the output light-exitting surface as shown in FIG. 3 (i) hereinafter explained in more detail.

The substantially optically smooth surfaces may be formed by known methods. For example, they may be formed by polishing the single crystal, by utilizing cleavage of the crystal, or by carefully growing the single crystal.

In a preferred embodiment of the present invention, the optical element accommodates an optical path with an optical path-length of not shorter than 0.05 mm. The function of the optical medium exhibiting the nonlinear optical effect is determined by the intensity of the incident light and the optical path-length. The practical laser light source may be employed if the optical path-length is not less than 0.05 mm.

Preferred examples of the shape of the optical element of the present invention are shown in FIG. 3. In FIG. 3, the input light-impinging surface is designated by the reference numeral 32, and the output light-exitting surface is designated by the reference numeral 34. FIG. 3 (a) shows a single crystal of the charge-transfer complex in the form of parallelpiped, and FIG. 3 (b) shows a single crystal in the form of a cubic. In these cases, any pair of surfaces may be used as the input light-impinging surface and output light-exitting surface. FIG. 3 (c) shows a crystal in the form of a plate having a pair of substantially parallel surfaces. In this case, the substantially parallel surfaces may be used as the input light-impinging surface and output light-exitting surface. The portions other than the two surfaces may have any form (in the illustrated example, the crystal is cylindrical). FIG. 3 (d) shows a crystal in the form of a pillar. The cross section of the pillar may be any shape such as circle, oval, truncated oval and polygonals. In this case, not only the end surfaces 32 and 34, but also the side surface of the pillar may be used as the input light-impinging surface or the output light-exitting surface. FIG. 3 (e) shows a crystal in the form of a curved cylinder. When the diameter of the cylinder is small, this shape is called as a fiber. FIG. 3 (f) shows a crystal in the form of a prism. In this case, the average optical path-length is not less than 0.05 mm. FIG. 3 (g) shows a crystal in the form of a convex lens. In this case, the thickness of the center portion of the lens is not less than 0.05 mm. FIG. 3 (h) shows a crystal in the form of an concaved lens. In this case, the thickness of the center portion of the lens is nog less than 0.05 mm. FIG. 3 (i) shows a crystal in the form of a flat plate. In this case, a single surface may simultaneously act as the input light-impinging surface and the output light-exitting surface. More particularly, a pair of prisms are placed on the plate. After passing through the prism 36, the input light passes through the plate and exits from another prism 38. In using this type of element, for example, a transparent film is placed on the element, and light is introduced into the film using a prism. The nonlinear optical effect may be obtained by the evanescent wave of the light. It is contemplated that such a single surface which acts as the input light-impinging surface and the output light-exitting surface is construed as "two surfaces" in claim 1, and such a mode is also included in the scope of the present invention.

The charge-transfer complex employed in the present invention may be prepared by known methods. For example, they may be prepared from the electron-accepting component and the electron-donating component by solution methods (the diffusion technique, slow evaporation, slow cooling), or by electro-crystallization method. These methods are described in detail in, for example, J. S. Miller and A. J. Epstein, "Synthesis and Properties of Low-dimensional Materials", Annals of the New York Academy of Science, vol. 313, pp. 293–300, 1978; J. Chem. Phys., 54, 2051 (1971) by T. C. Chiang et al; J. Amer. Chem. Soc., 99, 6631 (1977); and Mol. Cryst. Liq. Cryst., 62, 181 (1980) by H. J. Keller et al. More particularly, in the solution method, the electron-accepting component and the electron-donating component are dissolved in an appropriate solvent such as tetrahydrofurane (THF), halogenated hydrocarbons and acetonitrile. Then the single crystal of the charge-transfer complex may be precipitated by concentrating the solution by evaporating the solvent, or by slowly cooling the solution. The precipitated crystal is collected by filtration and washed with ether and dried.

The present invention also provides a third-order nonlinear optical device comprising the third-order nonlinear optical element of the present invention. By combining, in a conventional manner, the third-order nonlinear optical element of the present invention with at least one optical element selected from the group consisting of prism couplers, grating couplers, directional couplers, polarizers, half-mirrors, and mirrors, third-order nonlinear optical devices such as optical bistable device, phase-conjugated-wave generator, all-optical switch and the like can be provided. More particularly, an optical bistable device having optical resonator constitution can be obtained with the third-order nonlinear optical element and two partially transmitting mirrors, a phase-conjugated-wave generator can be obtained with the element and two half-mirrors and one totally reflecting mirror, and an all-optical switch can be obtained with the element and two polarizers.

In operation, incident operating light is impinged on the input light-impinging surface. In this case, any one or more of electric-field polarization directions of the incident operating light is substantially not perpendicular to the axis exhibiting the maximum third-order nonlinear optical susceptibility of the third-order nonlinear optical element. Preferably, at least one of electric-field polarization directions of incident operating lights is substantially parallel to the axis exhibiting maximum third-order nonlinear optical susceptibility of the third-order nonlinear optical element. More preferably, at least one of incident pumping lights, which are defined as the intense lights inducing nonlinear optical effects such as nonlinear refractive index change in the element, is substantially a linearly polarized light whose electric-field polarization direction is substantially parallel to the axis exhibiting maximum third-order nonlinear optical susceptibility of the third-order nonlinear optical element. When the element is a single crystal having a mixed stack structure, at least one of electric-field polarization directions of the incident operating light is preferably substantially parallel to the charge-transfer axis of the third-order nonlinear optical element, since the charge-transfer axis substantially coincides with the axis exhibiting maximum third-order nonlinear optical susceptibility of the third order nonlinear optical element. Preferably, at least one of electric-field polarization directions of incident operating lights is substantially parallel to the charge-transfer axis of the third-order nonlinear optical element. More preferably, at least one of incident pumping lights is substantially a linearly polarized light whose electric-field polarization direction is substantially parallel to the charge-transfer axis of the third-order nonlinear optical element. Other than this point, the method of using the third-order nonlinear optical element of the present invention is the same as that of the conventional semiconductor third-order nonlinear optical element. It is also an advantageous characteristic of the optical device of the present invention that the element can be operated not only by a conventional laser light source such as YAG laser and a tunable dye laser, but also by a semiconductor laser.

The invention will now be described based on the examples thereof. The examples are presented for the illustration purpose only and should not be interpreted in any restrictive way.

EXAMPLE 1

In this example, the solution method for obtaining crystals of the charge-transfer complexes, and the measurement of their optical nonlinearities are described.

An equimolar mixture of an electron-accepting component and an electron-donating component, weighed from 0.5 to 2.0 g, were dissolved in an appropriate solvent such as tetrahydrofurane (THF), chloroform and acetonitrile. More particularly, crystals of TCNE/perylene complex was obtained from THF/chloroform mixed solvent, TCNQ/p-phenylenediamine from chloroform, TCNQ/lithium from acetonitrile, TCNQ/sodium from acetonitrile, CA/p-phenyenediamine from THF/chloroform, TNF/1,5-diaminonaphthalene from THF/chloroform, PMDA/pyrene from acetic acid, and others in Table 1 were obtained from THF. Then the single crystals of the charge-transfer complex were precipitated by concentrating the solution by evaporating the solvent, or by slowly cooling the solution. In any methods, temperature was controlled to be lower than the temperature at which the solution showed obviously a color of charge-transfer complex. The precipitated crystals were collected by filtration, washed with ether and dried.

Using a mechanical mill, single crystals of charge-transfer crystals were pulverized and the pulverized crystals were separated based on the particle size using a stainless steel mesh. The nonlinear optical effect was evaluated by measuring their second harmonic generation (SHG) and third harmonic generation (THG) by the powder method of S. K. Kurtz et al (J. Applied Physics 39, 3798 (1966)).

As a light source, a light from a difference-frequency generator (wave-length of 1.80–2.15 $\mu$m; in case where the wave-length is 1.90 μm, average pump power density of 10 W/cm$^2$, duration of the pump pulse light of about 5.5 nsec., the repitition rate of 10 Hz and the peak pump power density of about 180 MW/cm$^2$) which is obtained by combining YAG laser and a tunable dye laser was employed.

In the evaluation by the powder method, the degree of the nonlinear optical effect was evaluated by comparing the results with that shown by known standard materials. As this standard, urea was used for the evaluation of the SHG, and PTS was used for the evaluation of THG. PTS was prepared by thermally polymerizing the monomer crystal powder of which particle size was unified beforehand.

The results of the measurement of the nonlinear optical effect of the complexes and the comparative compounds are summarized in Table 1. Since the particle size of the complex greatly influence the results of measurement because of the phase matching condition, only the particles with a particle size of not larger than 1 μm were used.

Various charge-transfer complexes consisting essentially of the various electron-accepting component and various electro-donating component are shown as Complexes 1 to 25. All of them are SHG inactive and THG active. In such a case, the observed light with the THG wave-length (3 ω, wherein ω is the fundamental frequency) is not generated by the light mixing (2 ω+ω) of the second harmonic (SH) and the fundamental light, but is the genuine third harmonic (TH), so that it correctly reflects the degree of the third-order nonlinear optical effect of the materials. The wave-length of the light from the light source used in the measurement was 1.90 μm, and the degree of SHG and THG are expressed in terms of the relative value taking the value of urea or PTS as 1.0, respectively.

The single crystals of the charge-transfer complexes which may be employed in the present invention are optical media exhibiting only the third-order nonlinear optical effect, so that they are preferable for constituting the nonlinear optical element as mentioned before.

Some of the complexes exhibited THG greater than that shown by PTS. For example, TCNE/perylene complex (Complex 3), the TCNQ/perylene complex (Complex 6), PhQ/pyrene complex (Complex 14) and the DDQ/phenanthrene complex (Complex 18) exhibited THG of 4.1 times, 2.4 times, 1.3 times and 1.0 times greater than that exhibited by PTS, respectively. On the other hand, the constituents of these complexes, for example, TCNE (Comparative Compound 3), TCNQ (Comparative Compound 4) and perylene (Comparative Compound 5) do not exhibited third-order nonlinear optical effect at all or only slightly exhibited. Thus, it can be seen that what gives the third-order nonlinear optical effect is the structure of the charge-transfer.

TABLE 1

|  |  |  | optical nonlinearity | | |
|---|---|---|---|---|---|
|  |  |  | (color) | SHG | THG |
|  | Sample |  |  |  |  |
| Comparative compound 1 | Urea |  | white | 1.0 | 0.0 |
| Comparative compound 2 | PTS |  | black | 0.0 | 1.0 |
| Comparative compound 3 | TCNE |  | white | 0.0 | 0.0 |
| Comparative compound 4 | TCNQ |  | yellow | 0.0 | 0.1 |
| Comparative compound 5 | perylene |  | yellow | 0.0 | 0.0 |
|  | Electron Acceptor | Electron Donor |  |  |  |
| Complex 1 | TCNE | naphthalene | brown | 0.0 | 0.6 |
| Complex 2 | TCNE | phenanthrene | black | 0.0 | 0.3 |
| Complex 3 | TCNE | perylene | green | 0.0 | 4.1 |
| Complex 4 | TCNQ | anthracene | light green | 0.0 | 0.3 |
| Complex 5 | TCNQ | pyrene | brown | 0.0 | 0.4 |
| Complex 6 | TCNQ | perylene | green | 0.0 | 2.4 |
| Complex 7 | TCNQ | p-phenylenediamine | reddish brown | 0.0 | 0.2 |
| Complex 8 | TCNQ | stilbene | green | 0.0 | 0.4 |
| Complex 9 | TCNQ | lithium | violet | 0.0 | 0.3 |
| Complex 10 | TCNQ | sodium | violet | 0.0 | 0.1 |
| Complex 11 | RTCNQ | 1,5-diaminonaphthalene | green | 0.0 | 0.5 |
| Complex 12 | BQ | pyrene | black | 0.0 | 0.4 |
| Complex 13 | PhQ | naphthalene | yellow | 0.0 | 0.5 |
| Complex 14 | PhQ | pyrene | orange | 0.0 | 1.3 |
| Complex 15 | PhQ | durene | yellow | 0.0 | 0.5 |
| Complex 16 | PhQ | N,N-dimethyl-α-naphthylamine | yellow | 0.0 | 0.5 |
| Complex 17 | CA | perylene | dark green | 0.0 | 0.9 |
| Complex 18 | CA | p-phenylenediamine | brown | 0.0 | 0.3 |
| Complex 19 | DDQ | phenanthrene | dark green | 0.0 | 1.0 |
| Complex 20 | DDQ | durene | brown | 0.0 | 0.5 |
| Complex 21 | TNF | pyrene | reddish orange | 0.0 | 0.4 |
| Complex 22 | TNF | TMPD | black | 0.0 | 0.6 |
| Complex 23 | TNF | 1,5-diaminonaphthalene | black | 0.0 | 0.4 |
| Complex 24 | TNF | TTF | black | 0.0 | 0.3 |
| Complex 25 | PMDA | pyrene | white | 0.0 | 0.8 |

TABLE 1-continued

|  |  |  |  | optical nonlinearity | |
|---|---|---|---|---|---|
|  |  |  | (color) | SHG | THG |
| Complex 26 | iodine | 1,5-diaminenaphthalene | green | 0.0 | 0.1 |

PTS: poly(2,4-hexadiyn-1,6-diol bis(p-toluenesulfonate))
TCNE: tetracyanoethylene
TCNQ: 7,7,8,8-tetracyanoquinodimethane
RTCNQ: diisopropyl-7,8-dicyanoquinodimethane-7,8-dicarboxylate
BQ: p-benzoquinone
PhQ: 9,10-phenanthrenequinone
CA: chloranil
DDQ: 2,3-dichloro-5,6-dicyano-1,4-benzoquinone
TNF: 2,4,7-trinitrofluorene
TMPD: N,N,N',N'-tetramethyl-p-phenylenediamine
TTF: tetrathiafulvalene
PMDA: pyromellitic dianhydride The results of the test which examined the particle size dependency and the pump-light wave-length dependency of THG intensities of PTS, TCNE/perylene complex 3 and the TCNQ/perylene complex 6 are shown in FIG. 4 (a)-(c), respectively and in FIG. 4 (d). In FIG. 4 (d), the results of the PTS, TCNE/perylene complex and TCNQ/perylene complex are shown by the curves 3, 1 and 2, respectively.

The particle size dependency of THG which was measured at a fundamental wave-length of 1.90 μm shown in FIG. 4 (a)-(c) will now be discussed. Each of them exhibits non-phase matching characteristics. However, TCNE/perylene complex and TCNQ/perylene complex exhibited larger THG than PTS at any particle size. Thus, it was confirmed that TCNE/perylene complex and TCNQ/perylene complex have higher performance than PTS.

The results shown in FIG. 4 (d) obtained for the particles with a particle size of 74–105 μm will now be discussed. TCNE/perylene complex exhibited larger THG than PTS at any tested wave-length, and TCNQ/perylene complex exhibited larger THG than PTS at any tested wave-length except for 2.15 μm. Thus, it was confirmed that they are superior as third-order nonlinear optical materials than PTS and that they work in the wide range of wavelengths as well as PTS.

The tested samples were identified to be crystals of charge-transfer complexes by the following procedure:

A part of the sample was dissolved and subjected to a chromatography of silica gel/chloroform system. The complex was separated into the electron-accepting component and the electron-donating component, and each spot was confirmed.

Infrared absorption spectrum analysis of the sample was conducted. It was confirmed that the observed spectrum is substantially a simple total of the infrared absorption spectra of the electron-accepting component and the electron-donating component.

The elemental analysis (C, H, N) was conducted for TCNE/perylene complex and TCNQ/perylene complex. The results are as follows:
TCNE/perylene complex: C: 82.6 wt %, H: 3.6 wt %, N: 14.3 wt %
TCNQ/perylene complex: C: 84.8 wt %, H: 3.5 wt %, N: 11.7%

From these results, the each sample was identified to be a charge-transfer complex consisting of the electron-accepting component and the electron-donating component with a molar ratio of 1:1.

EXAMPLE 2

In this example, the process of obtaining single crystals of the charge-transfer complex having high purity and high quality, and a process of forming an optically smooth surface are described.

Preparation of Single Crystals of Charge-Transfer Complex (i) TCNE/perylene complex TCNE and perylene, which are the starting materials, were firstly purified. Perylene was subjected to a silica gel chromatography using mixture of tetrahydrofuran/chloroform/benzene (1/1/1, v/v) as a developer to separate the perylene from the other polycyclic aromatic compounds as impurities. Perylene was further purified by sublimation through active carbon layer under $10^{-3}$ torr, at 350°–400° C.

TCNE was completely purified by the sublimation through active carbon layer under $10^{-3}$ torr, at 100°–120° C.

Then 1 g of equimolar mixture of TCNE and perylene was dissolved in 100 ml of a mixed solvent of chloroform/dichloromethane (3/1 v/v) while slightly heating the solvent. After allowing to cool, the solution was filtered through Teflon membrane filter with a pore size of 1 μm, and the filtrate was slowly cooled from the room temperature to −20° C. at a rate of about 1° C./hr to obtain several green-black crystals in the form of a thin plate (the largest one sized 5 mm length×2 mm width×300 μm thickness). After collecting the crystals by filtration, the crystals were washed with ether and was dried in the air. The crystals were confirmed to be single crystals by observing them with a polarizing microscope with closed nicols.

(ii) TCNQ/perylene complex

TCNQ was purified by the sublimation through active carbon layer under $10^{-3}$ torr, at 220°–250° C.

Then 1 g of equimolar mixture of TCNQ and perylene was dissolved in 250 ml of chloroform while slightly heatig the solvent. After allowing to cool, the solution was filtered through Teflon membrane filter with a pore size of 1 μm, and the filtrate was slowly cooled from the room temperature to −20 ° C. at a rate of about 1° C./hr to obtain several purple-black crystals in the form of an elongated plate (the largest one sized 5 cm length, ×1 mm width×400 μm thickness). After collecting the crystals by filtration, the crystals were washed with ether and was dried in the air. The crystals were confirmed to be single crystals by observing them with a polarizing microscope under closed nicols. [Processing of the charge-transfer crystals into third-order nonlinear optical element]

On a glass plate, diamond polisher dispersed in water was spread to obtain a polishing plate. The surface of the single crystal of the charge-transfer complex obtained as mentioned above was polished. Since the crystals were likely to be broken, the polishing was conducted by merely slipping the crystals on the plate without pressing the crystals to the plate.

EXAMPLE 3

In this example, how to determine the maximum value $X^{(3)}$ of the third-order nonlinear optical susceptibility and the direction of the axis exhibiting the maximum third-order nonlinear optical susceptibility is described by taking TCNE/perylene complex as an example.

The maximum value of the third-order nonlinear optical susceptibility and the direction of the axis exhibiting the maximum third-order nonlinear optical susceptibility were determined by measuring the intensity of the third-harmonic (TH) of the sample with respect to the polarization direction of the linearly polarized laser light and by comparing the results with a control sample whose maximum value of the third-order nonlinear optical susceptibility and the direction of the axis exhibiting the maximum third-order nonlinear optical susceptibility is known. As the control, isotropic quartz glass was used.

The polished very thin charge-transfer complex crystal on the glass substrate was mounted on a goniometer. The crystal was rotated about an axis perpendicular to the incidence axis of the laser pulse light, and the relationship between the incident angle and the observed intensity of the TH was checked. This procedure was repeated while gradually changing the angle between the incident laser pulse light and the crystal plane or the angle between the polarization direction of the laser light and the crystal orientation (the base was an arbitrary side of the crystal). That is, the measurement was conducted in accordance with so called THG-Maker fringe method (Electron. Lett., vol 23, No. 11, 595 (1987)).

It turned out that, the direction exhibiting the maximum nonlinear optical susceptibility existed on the large crystal face (1 0 0) and in coincident with the widthwise direction, i.e., crystal b axis (direction of charge-transfer), and the measured nonresonant $X^{(3)}$ was $2.8 \times 10^{-10}$ esu at the wave-length of 1.9 $\mu$m. Converting into the nonlinear refractive index $n_2$, this corresponds to $5.6 \times 10^{-12}$ (W/cm$^2$)$^{-1}$. $X^{(3)}$'s obtained in the other two directions perpendicular to the charge-transfer axis were only 1/100 of that obtained along the charge-transfer axis.

As to the TCNQ/perylene complex crystal, the maximum and nonresonant $X^{(3)}$ was $1.9 \times 10^{-10}$ esu at a wave-length of 1.9 $\mu$m, which corresponds to 2 of $3.8 \times 10^{-12}$ (W/cm$^2$)$^{-1}$. In general, $X^{(3)}$ in the resonant wavelength region is much larger than that in the nonresonant. As mentioned before, resonant $X^{(3)}$ of PTS was obtained to be $1 \times 10^{-10}$ esu in our measurement. Therefore, it can be concluded that the above two complex crystals are more efficient nonlinear optical media than PTS.

EXAMPLE 4

Figure 1B:
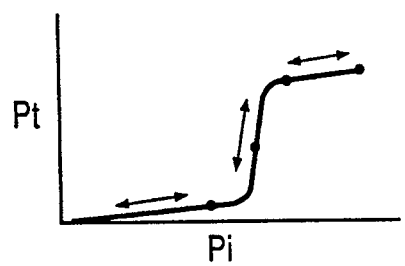
Figure 1C:
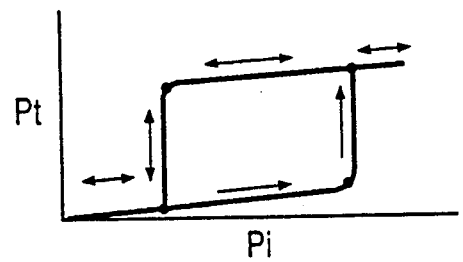

An embodiment of the third-order nonlinear optical device of the present invention is shown in FIG. 1 (a).

The nonlinear optical element 11 consisting of a single crystal of the TCNE/perylene complex having two optically smooth surfaces is sandwiched between a parallel pair of vacuum-deposited multilayer dielectric mirrors which 12 and 12' reflects 90% of the incident light and passes the rest of the incident light. This structure constitute so called an outer optical resonator. This device can be operated by satisfying the resonance condition of the resonator by slightly changing the wave-length of the input light or the optical length of the resonator (i.e., distance between the mirrors). In this example, a laser light with a wave-length of 1.064 $\mu$m from Nd$^{3+}$-YAG laser was used as an input light which is a pumping light and also a signal light, and the resonance condition was satisfied by changing the optical length of the resonator. Limiting and bistable operations between the input light intensity Pi and the output light intensity Pt as shown in FIG. 1 (b) and (c) were obtained.

The minimum intensity of the input light (Pi$^{min}$) for the operation of this device is obtained in accordance with the equation of:

$$Pi^{min} \approx (K\lambda)/(n_2 l)$$

(wherein $\lambda$ is the wave-length of the light, l is the optical length of the optical medium, K ($\approx 0.001$) is a coefficient determined by the reflectance of the mirror and the adjustment of the optical length of the resonator). In this example, since $\lambda = 1.064$ $\mu$m and l=0.3 mm, Piphu min=$1.1 \times 10^6$ W/cm$^2$.

In the case where a semiconductor laser is used as the light source, which has the effective output power of 30 mW and emitting wave-length of 0.83 um, if the diameter of the laser beam is focused to 1 um, the light intensity is calculated to be $3.8 \times 10^6$ W/cm$^2$, so that it is sufficiently higher than the Pi$^{min}$ of the above-obtained third-order nonlinear optical element. Thus, it was shown that the third-order nonlinear optical element of the present invention can be operated using the semiconductor laser as the light source.

The nonlinear refractive index of the present nonlinear optical medium is entirely caused by the non-resonance effect (which does not accompany the absorption) due to the pure electronic polarization, so that the response time is expected to be as short as $10^{-14}$ sec. When compared this response time with that of the super lattice crystal of GaAs-GaAlAs whose nonlinear refractive index is given by the excitation of the exitons by light absorption, $4 \times 10^{-8}$ sec., or with that of the nonlinear optical liquid CS$_2$ whose nonlinear refractive index is given by the molecular orientation Kerr effect due to the rotation relaxation of the molecule responding to the applied optical electric field, $10^{-11}$ to $10^{-12}$ sec, it is apparent that the response time of the optical medium employed in the present invention is much shorter than those of the conventional third-order nonlinear optical element.

It should be noted, however, the response time of the nonlinear optical element is determined by whichever longer one of the response time $\tau$ of the optical medium or the lifetime of the photon tp in the optical resonator, and can be calculated in accordance with the following equation:

$$tp = -lop/(C l n R)$$

(wherein lop is the optical length of the resonator, C is light velocity, R is the reflectance of the mirror). In the present case, the tp is calculated to be $6 \times 10^{-11}$ sec., which is greater than $\tau$, this is the response time of the device. In this example, the response time of the optical element was confirmed to be shorter than $10^{-10}$ second.

EXAMPLE 5

The operations of the non-linear optical device constructed as in Example 4 except that a single crystal of TCNQ/perylene complex with substantially optically smooth surfaces was used as a nonlinear optical element, was examined using $Nd^{3+}$-YAG laser as the light source. As a result, the limiting and bistable operations similar to those of the TCNE/perylene device shown in FIG. 1 (b and (c) were obtained.

EXAMPLE 6

Figure 5:
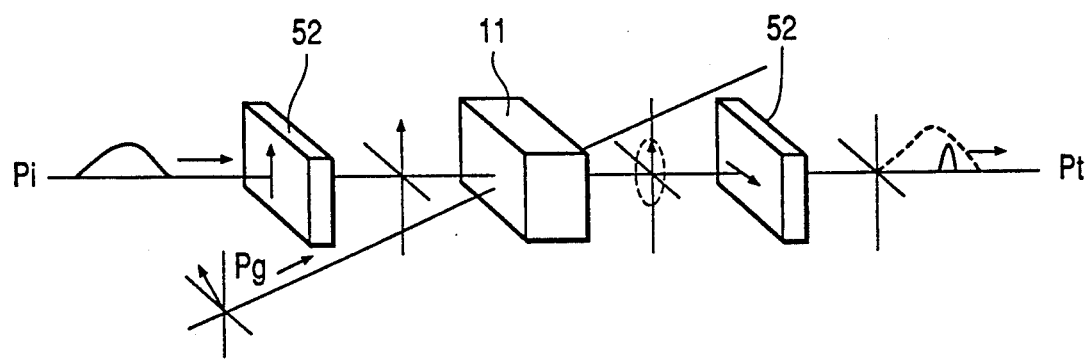
FIG. 5 is a schematic view of an embodiment of an all-optical switch.

An embodiment of an all-optical switch is illustrated in FIG. 5. A pair of polarizers 52 and 52' are arranged such that polarization axes thereof arranged perpendicularly, so that the pair of polarizers 52 and 52' constitute a closed nicols system. The third-order nonlinear optical element 11 obtained in Example 2 is interposed between the polarizers 52 and 52'. With this structure, a linearly polarized light after the polarizer 52, which is the input signal light, passes through the polarizer 52' only when the gate pulse Pg, which is the input pumping light, is impinging on the nonlinear optical element because of the rotation of the polarizing angle by the change of the refractive index of the nonlinear optical element 11. Thus, switching operation can be conducted with the gate light.

For this device, the employable wave-length range, response time and the minimum intensity of the input light required for the operation (gate pulse light) are important. It is apparent from the description of Examples 4 and 5, that the device employing the TCNE/perylene complex has an excellent employable wavelength range and response time. The minimum gate pulse intensity required ($P(\mu/\pi)$) is given by the following equation:

$$P(\mu/\pi) = \lambda/(2\ n_2 l).$$

In this example, since $\lambda = 1.064$ $\mu$m and $l = 0.3$ mm, $P(2/\pi) = 3.2 \times 10^8$ W/cm$^2$. Since the optical transmittance T is practically determined in accordance with the equation of $T = \sin^2\{(Pi/P\mu/\pi)) \times (\mu/\pi)\}$, it is apparent that this device can be operated with a focused laser beam.

EXAMPLE 7

Figure 6:
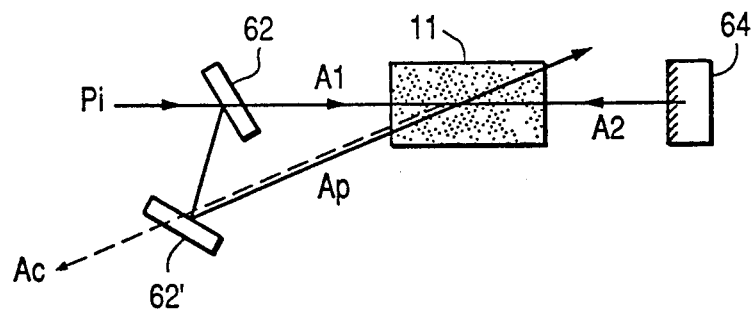
FIG. 6 is a schematic view of an embodiment of a phase-conjugated-wave generator.

An embodiment of a phase-conjugated-wave generator is shown in FIG. 6. The nonlinear optical element 11 consisting essentially of TCNE/perylene complex obtained in Example 2 is interposed between a half mirror 62 and a totally reflecting mirror 64. The totally reflecting mirror 64 is set perpendicularly to the input light Pi. The half mirror 62 is arranged slant with respect to the optical path of the input light Pi. Another half mirror 62' is placed so as to reflect the light coming from the half-mirror 62 into the element. This structure is called degenerate four-wave mixing (DFWM) constitution. When three lights $A_1$, $A_2$ and $A_p$, here $A_1$ and $A_2$ are the pumping lights and $A_p$ is the probing light, impinge on the nonlinear optical element 11, a fourth output signal light Ac, called output phase-conjugated light whose spatial phase term alone is conjugated with the light Ap, is generated. This phase-conjugated wave is drawing attention as a useful mean for image correction and real time holography (as to its application, see "O plus E", March, p.73 (1982)). With this example, the high speed response and the low minimum input light intensity were confirmed.

We claim:

1. A third order nonlinear optical device comprising a third order nonlinear optical element formed of a single crystal having at least two optically smooth surfaces, having transparency to the input light at least one wavelength in the range from 0.65 $\mu$m to 2.0 $\mu$m, said single crystal comprising a charge-transfer complex consisting essentially of:

at least one electron-accepting component selected from the group consisting of cyano compounds, quinones, nitro compounds, acid anhydride, halogens, and halogenated carbons;

said cyano compounds being selected from the group consisting of tetracyanotheylene, tricyanoethylene, methyltricyanoethylene carboxylate, hexacyanobutadiene, tetracyanobenzene, 7,7,8,8-tetracyanoquinodimethane, 11,11,12,12-tetracyanonaphthoquinodimethane, 2,5-bis(-dicyanomethylene)-2,5-dihydrothiophene, 2,5-bis(-dicyanomethylene)-2,5-selenophene, hexacyanotrimethylenecyclopropane, 2,4-bis(dicyanomethylene)-1,3-dithioethane, tetracyanoquinoquinazolinoquinozoline and derivatives thereof;

said quinones being selected from the group consisting of p-benzoquinone, naphthoquinone, 9,10-phenanthrenequinone, chloranil, 2,3-dichloro-5,6-dicyano-1,4-benzoquinone, 11,11,12,12-tetracyano-1,4-naphthoquinodimethane and derivatives thereof;

said nitro compounds being selected from the group consisting of trinitrobenzene, picric acid, 4,7-trinitrofluorenone and derivatives thereof;

said acid anhydride being selected from the group consisting of maleic anhydride, pyromellitic acid anhydride and derivatives thereof, said halogens being selected from the group consisting of bromine and iodine;

said halogenated carbons being selected from the group consisting of tetrabromemethane and bromotrichloromethane, and at least one electron-donating component selected from the group consisting of unsaturated cyclic hydrocarbon compounds, unsaturated heterocyclic compounds, chalcogen-containing compounds, quaternary unsaturated heterocyclic compounds and metals;

said unsaturated cyclic hydrocarbon compounds being selected from the group consisting of naphthalene, anthracene, phenanthrene, pyrene, N,N,N',N'-tetramethyl-p-phenylenediamine, hydroquinone, durene, N,N-dimethyl-$\alpha$-naphthylamine, diaminonaphthalene, diaminopyrene, stilbene, diaminostilbene and derivatives thereof;

said unsaturated heterocyclic compounds being selected from the group consisting of pyridine, qunoline, phenothiazine, indole, skatole, thymine, furan, benzofuran, thiophene, selenophene and derivatives thereof;

said chalcogen-containing compounds being selected from the group consisting of tetrathiafulvalene, tetraselenafulvalene, tetrathiatetracene, tetraselenatetracene, bithiapyrane, tetraphenylbithiapyrane and derivatives thereof;

said quaternary unsaturated heterocyclic compounds being selected from the group consisting of N-methylphenadium, 1,2-di(N-ethyl-4-pyridinium) ethylene, quinolinium, N-methylacridinium and derivatives thereof;

said metals being selected from the group consisting of copper, silver, lead, nickel, lithium, sodium, potassium, barium, chromium, molybdenum, tungsten, cobalt, iron, antimony, cesium and magnesium;

said charge-transfer complex being formed of said electron-accepting component and said electron-donating component being selected so that the difference (Ip−Ea) of the electron affinity (Ea) and the ionization potential (Ip) is large enough for the formation of charge-transfer complex in the ground state;

at least one of said components being an organic compound having a $\pi$-conjugated system.

2. The third-order nonlinear optical device of claim 1, wherein said charge-transfer complex consists essentially of the electron-accepting component of an organic compound with $\pi$-conjugated system selected from the group consisting of cyano compounds, quinones, nitro compounds, and acid anhydride, and the electron-donating component of an organic compound with $\pi$-conjugated system selected from the group consisting of unsaturated cyclic hydrocarbon compounds and unsaturated heterocyclic compounds.

3. The third-order nonlinear optical device of claim 1 or 2, wherein at least one of hydrogens in the electron-accepting component and/or the electron-donating component is substituted by a heavy hydrogen.

4. The third-order nonlinear optical device of claim 1 or 2, wherein said optically smooth surfaces are parallel to the axis exhibiting maximum third-order nonlinear optical susceptibility.

5. The third-order nonlinear optical device of claim 1 or 2, wherein said single crystal of the charge-transfer complex has a mixed stack structure in which the electron-accepting component and the electron-donating component stack alternately plane-to-plane.

6. The third-order nonlinear optical device of claim 5, wherein said optically smooth surfaces are not perpendicular to the charge-transfer axis of said single crystal of the charge-transfer complex.

7. The third-order nonlinear optical device of claim 6, wherein said optically smooth surfaces are parallel to the charge-transfer axis of said single crystal of the charge-transfer complex.

8. The third-order nonlinear optical device of claim 2, wherein said electron-accepting component is a cyano compound having at least one dicyanomethylene group.

9. The third-order nonlinear optical device of claim 2, wherein said electron-donating component is a monocyclic or a polycyclic aromatic component is a monocyclic or a polycyclic aromatic compound.

10. The third-order nonlinear optical device of claim 2, wherein said electron-accepting component is a cyano compound having at least one dicyanomethylene group and said electron-donating component is a monocyclic or a polycyclic aromatic compound.

11. The third-order nonlinear optical device of claim 9, wherein said electron-accepting component is 9,10-phenanthrene quinone and said electron-donating component is pyrene.

12. The third-order nonlinear optical device of claim 10, wherein said electron-accepting component is 2,3-dichloro-5,6-dicyano-1,4-benzoquinone and said electron-donating component is phenanthrene.

13. The third-order nonlinear optical device of claim 10, wherein said electron-accepting component is tetracyanotheylene and said electron-donating component is perylene.

14. The third-order nonlinear optical element of claim 1 or 2, which accommodates an optical path with an optical path-length of not shorter than 0.05 mm.

15. The third-order nonlinear optical device of claim 1, further comprising at least one optical element selected from the group consisting of prism couplers, grating couplers, directional couplers, polarizers, half-mirrors and mirrors, optically connected to the third-order nonlinear optical element.

16. The third-order nonlinear optical device of claim 1, further comprising at least one optical element selected from the group consisting of prism couplers, grating couplers, directional couplers, polarizers, half-mirrors and mirrors, optically connected to the third-order nonlinear optical element.

17. A third-order nonlinear optical device comprising a third-order nonlinear optical element having at least two substantially optically smooth surfaces and comprising a charge-transfer complex consisting essentially of 7, 7, 8, 8-tetracyanoquinodimethane as an electron-accepting component and perylene as an electron-donating component.

* * * * *